United States Patent
Hirose

(10) Patent No.: US 10,685,685 B2
(45) Date of Patent: Jun. 16, 2020

(54) SEMICONDUCTOR INTEGRATED CIRCUIT

(71) Applicant: SOCIONEXT INC., Kanagawa (JP)

(72) Inventor: Masanobu Hirose, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 16/574,989

(22) Filed: Sep. 18, 2019

(65) Prior Publication Data

US 2020/0013436 A1 Jan. 9, 2020

Related U.S. Application Data

(63) Continuation of application No. PCT/JP2018/006476, filed on Feb. 22, 2018.

(30) Foreign Application Priority Data

Mar. 21, 2017 (JP) .................................. 2017-054125

(51) Int. Cl.
*G11C 5/14* (2006.01)
*H03K 17/56* (2006.01)

(52) U.S. Cl.
CPC ............. *G11C 5/148* (2013.01); *H03K 17/56* (2013.01)

(58) Field of Classification Search
None
See application file for complete search history.

(56) References Cited

U.S. PATENT DOCUMENTS

| 7,791,406 B1* | 9/2010 | Wang ................ H03K 19/0016 326/34 |
| 9,329,669 B2 | 5/2016 | Jeon |
| 2011/0074464 A1* | 3/2011 | Gunaratna ........... H03K 17/005 326/41 |
| 2019/0326887 A1* | 10/2019 | Kaya ...................... H03K 3/011 |
| 2020/0013436 A1* | 1/2020 | Hirose .................. G11C 11/413 |

FOREIGN PATENT DOCUMENTS

| JP | 2007-164822 A | 6/2007 |
| JP | 2009-223427 A | 10/2009 |

OTHER PUBLICATIONS

International Search Report issued in International Patent Application No. PCT/JP2018/006476, dated Mar. 27, 2018; with English translation.

* cited by examiner

*Primary Examiner* — Lincoln D Donovan
*Assistant Examiner* — Khareem E Almo
(74) *Attorney, Agent, or Firm* — McDermott Will & Emery LLP

(57) ABSTRACT

In a semiconductor integrated circuit employing power gating, a control input signal is propagated to one or more first power switches through a first propagation path and to one or more second power switches through a second propagation path. A restoration determination circuit receives a first signal of the first propagation path and a second signal of the second propagation path and generates a control output signal. When the control signal performs restoration transition, the restoration determination circuit causes the control output signal to perform the restoration transition in accordance with a later timing of timings of restoration transitions of the first and second signals.

11 Claims, 11 Drawing Sheets

SEMICONDUCTOR INTEGRATED CIRCUIT

CROSS-REFERENCE TO RELATED APPLICATIONS

This is a continuation of International Application No. PCT/JP2018/006476 filed on Feb. 22, 2018, which claims priority to Japanese Patent Application No. 2017-054125 filed on Mar. 21, 2017. The entire disclosures of these applications are incorporated by reference herein.

BACKGROUND

The present disclosure relates to a technology of reducing power consumption of a semiconductor integrated circuit.

As a technology of reducing power consumption of a semiconductor integrated circuit, power gating has been known. Power gating is a technology in which power supply to a circuit portion that is not in operation in the semiconductor integrated circuit is cut off to achieve reduction in leak current.

In U.S. Pat. No. 9,329,669, a configuration in which power gating switches used for performing power cutoff in each circuit portion are connected in series and sleep signals that control power cutoff are sequentially transmitted is described.

SUMMARY

In a semiconductor integrated circuit employing power gating, when a certain circuit portion is restored from a power cutoff state, a so-called rush current is generated. Therefore, for example, when many circuit portions are simultaneously restored from a power cutoff state, a large rush current is generated in the semiconductor integrated circuit, a power potential is reduced accordingly, and a probability that a malfunction of the semiconductor integrated circuit occurs is increased.

On the other hand, as a method of reducing this rush current problem, a method in which power gating switches are slowly turned on, a method in which power gating switches are divided into groups and are sequentially turned on, or the like has been known. For example, in the configuration of U.S. Pat. No. 9,329,669, a delay of each power gating switch is increased, and thereby, a power restoration timing is shifted, so that the occurrence of a rush current can be dispersed. However, a problem in which a required time for power restoration for the entire semiconductor integrated circuit is increased arises in the above described methods.

It is therefore an object of the present disclosure to provide, for a semiconductor integrated circuit employing power gating, a configuration in which influences of a rush current can be reduced while a required time for power restoration is reduced to a short time.

A semiconductor integrated circuit according to one embodiment of the present disclosure includes a circuit block including one or more first power switches disposed in a first direction and one or more second power switches disposed in a second direction, the circuit block includes a first propagation path through which a control input signal that is a power control signal that has been given to the circuit block and controls on and off of the first and second power switches is propagated to the one or more first power switches, a second propagation path through which the control input signal is propagated to the one or more second power switches, and a restoration determination circuit that receives a first signal that is the control input signal that has been delayed in accordance with a delay in the first propagation path and a second signal that is the control input signal that has been delayed in accordance with a delay in the second propagation path and generates a control output signal that is the power control signal that is output from the circuit block. When the control input signal performs restoration transition that is signal transition in which the first and second power switches are turned on from off, the restoration determination circuit causes the control output signal to perform the restoration transition in accordance with a later timing of a timing at which the first signal performs the restoration transition and a timing at which the second signal performs the restoration transition.

According to this embodiment, in the circuit block, the control input signal that is the power control signal that has been given to the circuit block is propagated to the one or more first power switches through the first propagation path, and also, is propagated to the one or more second power switches through the second propagation path. The restoration determination circuit receives the first signal that is the control input signal that has been delayed in accordance with the delay in the first propagation and the second signal that is the control input signal that has been delayed in accordance with the delay in the second propagation path and, when the control input signal performs restoration transition that is signal transition in which the first and second power switches are turned on from off, the restoration determination circuit causes the control output signal to perform the restoration transition in accordance with a later timing of a timing at which the first signal performs the restoration transition and a timing at which the second signal performs the restoration transition.

Thus, the control output signal that has been output from the circuit block performs restoration transition at a timing in accordance with the number or disposition positions of the first and second power switches, in other words, a timing in accordance with a size of the circuit block. As a result, respective power restoration timings of a plurality of the circuit blocks connected to one another in a chain so as to propagate the power control signal are shifted and this timing shift is a proper one in accordance with the size of each circuit block. Accordingly, a time required for power restoration can be reduced to a short time and influences of a rush current can be reduced.

A semiconductor integrated circuit according to another embodiment of the present disclosure includes a circuit block including one or more first power switches disposed in a first direction, one or more second power switches disposed in a second direction, and one or more third power switches disposed in the first or second direction, the circuit block includes a switch signal generation circuit that generates, based on first and second control input signals that are a first power control signal that controls on and off of the first and second power switches and a second power control signal that controls on and off of the first to third power switches, which are given to the circuit block, a first switch signal that controls on and off of the first and second power switches and a second switch signal that controls on and off of the third power switches, a first propagation path through which the first switch signal is propagated to the one or more first power switches, a second propagation path through which the first switch signal is propagated to the one or more second power switches, a third propagation path through which the second switch signal is propagated to the one or more third power switches, and a restoration determination circuit that receives a first signal that is the first switch signal that has been delayed in accordance with a delay in the first propagation path, a second signal that is the first switch signal that has been delayed in accordance with a delay in the second propagation path, and a third signal that is the second switch signal that has been delayed in accordance with a delay in the third propagation path and generates first and second control output signals that are the first and second power control signals that are output from the circuit block. When the first control input signal performs restoration transition that is signal transition in which the first and second power switches are turned on from off, the switch signal generation circuit causes the first switch signal to perform the restoration transition, the restoration determination circuit causes the first control output signal to perform the restoration transition in accordance with a later timing of a timing at which the first signal performs the restoration transition and a timing at which the second signal performs the restoration transition. Also, when the second control input signal performs second restoration transition that is signal transition in which the second control input signal turns the first to third power switches on from off, the switch signal generation circuit causes the first and second switch signals to perform the second restoration transition, and the restoration determination circuit causes the second control output signal to perform the second restoration transition in accordance with a latest timing of a timing at which the first signal performs the second restoration transition, a timing at which the second signal performs the second restoration transition, and a timing at which the third signal performs the second restoration transition.

According to this embodiment, the switch signal generation circuit generates, based on the first and second control input signals that are the first and second power control signals, which have been given to the circuit block, the first switch signal that controls on and off of the first and second power switches and the second switch signal that controls on and off of the one or more third power switches. The first switch signal is propagated to the one or more first power switches through the first propagation path, and also, is propagated to the one or more second power switches through the second propagation path. The second switch signal is propagated to the one or more third power switches through the third propagation path. The restoration determination circuit receives the first signal that is the first switch signal that has been delayed in accordance with the delay in the first propagation path, the second signal that is the first switch signal that has been delayed in accordance with the delay in the second propagation path, and the third signal that is the second switch signal that has been delayed in accordance with the delay in the third propagation path and generates the first and second control output signals that are first and second power control signals that are output from the circuit block.

Then, when the first control input signal performs restoration transition that is signal transition in which the first and second power switches are turned on from off, the restoration determination circuit causes the first control output signal to perform the restoration transition in accordance with a later timing of a timing at which the first signal performs the restoration transition and a timing at which the second signal performs the restoration transition. Thus, the first control output signal that is output from the circuit block performs the restoration transition at a timing in accordance with the number or disposition positions of the first and second power switches, in other words, at a timing in accordance with the size of the circuit block. Also, when the second control input signal performs second restoration transition that is signal transition in which the first to third power switches are turned on from off, the restoration determination circuit causes the second control output signal to perform the second restoration transition in accordance with a latest timing of a timing at which the first signal performs the second restoration transition, a timing at which the second signal performs the second restoration transition, and a timing at which the third signal performs the second restoration transition. Thus, the second control output signal that is output from the circuit block performs restoration transition at a timing in accordance with the number or disposition positions of the first to third power switches, in other words, at a timing in accordance with the size of the circuit block. As a result, power restoration timings of a plurality of the circuit blocks connected to one another in a chain so as to propagate the first and second power control signals are shifted and this timing shift is a proper one in accordance with the size of each circuit block. Accordingly, a time required for power restoration can be reduced to a short time and influences of a rush current can be reduced.

With a semiconductor integrated circuit according to the present disclosure, a time required for power restoration can be reduced to a short time and influences of a rush current can be reduced.

DETAILED DESCRIPTION

Embodiments will be described with reference to the accompanying drawings.

First Embodiment

In a first embodiment, a semiconductor integrated circuit has a sleep mode as a low power consumption mode (a low power mode). For example, in a memory block, in the sleep mode, most circuits other than a memory cell array, that is, for example, a row decoder, a column decoder, an IO system circuit, a control system circuit or the like, are put in a power cutoff state. However, in the sleep mode, memory data of a memory is held. In the present disclosure, a power control signal that controls the semiconductor integrated circuit to the sleep mode is referred to as a sleep signal. In this case, when the sleep signal is high, power supply to each circuit of a power supply target is cut off and, when the sleep signal is low, power supply to each circuit is maintained. Note that a relationship between the sleep signal and cutoff and maintenance of power supply is not limited thereto.

Figure 1:
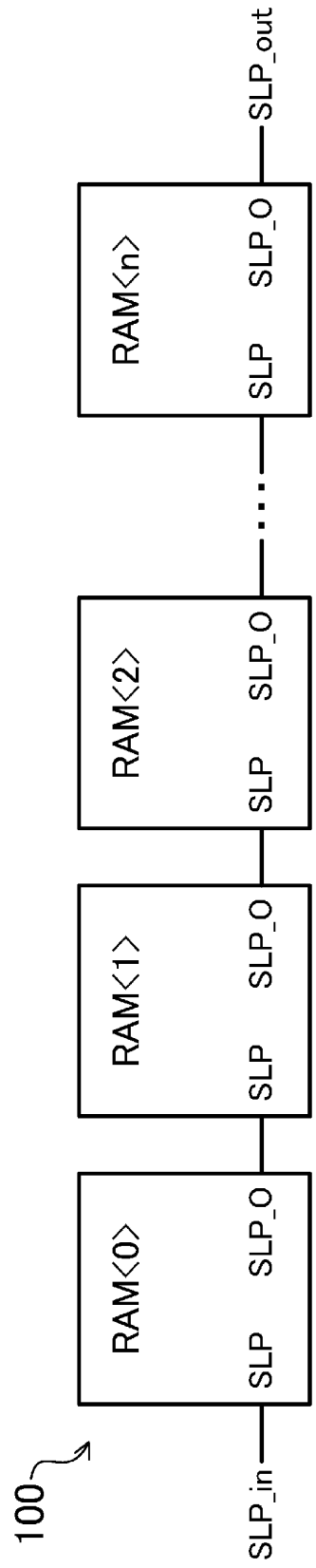
FIG. 1 is a block diagram illustrating a portion of a configuration of a semiconductor integrated circuit according to a first embodiment.

FIG. 1 is a block diagram illustrating a portion of a configuration of a semiconductor integrated circuit according to the first embodiment. A semiconductor integrated circuit 100 illustrated in FIG. 1 includes a plurality of memory blocks RAM <0> to <n>. The memory blocks RAM <0> to <n> are, for example, SRAMs. Note that the memory blocks RAM <0> to <n> are examples of circuit blocks. The plurality of memory blocks RAM <0> to <n> are connected to one another in a chain so as to propagate a sleep signal SLP_in that is an example of the power control signal. That is, RAM <0> receives the given sleep signal SLP_in as the signal SLP, performs power control in the block in accordance with the signal SLP, and delays and outputs the signal SLP as a signal SLP_O. RAM <1> receives the signal SLP_O output from RAM <0> as the sleep signal SLP, performs power control in the block in accordance with the signal SLP, and delays and outputs the sleep signal SLP as the signal SLP_O. Thereafter, in a similar manner, the sleep signal is transmitted to RAM <2> . . . RAM <n>. The signal SLP_O output by RAM <n> is, for example, returned as a sleep signal SLP_out to a controller that has output the sleep signal SLP_in.

Figure 2:
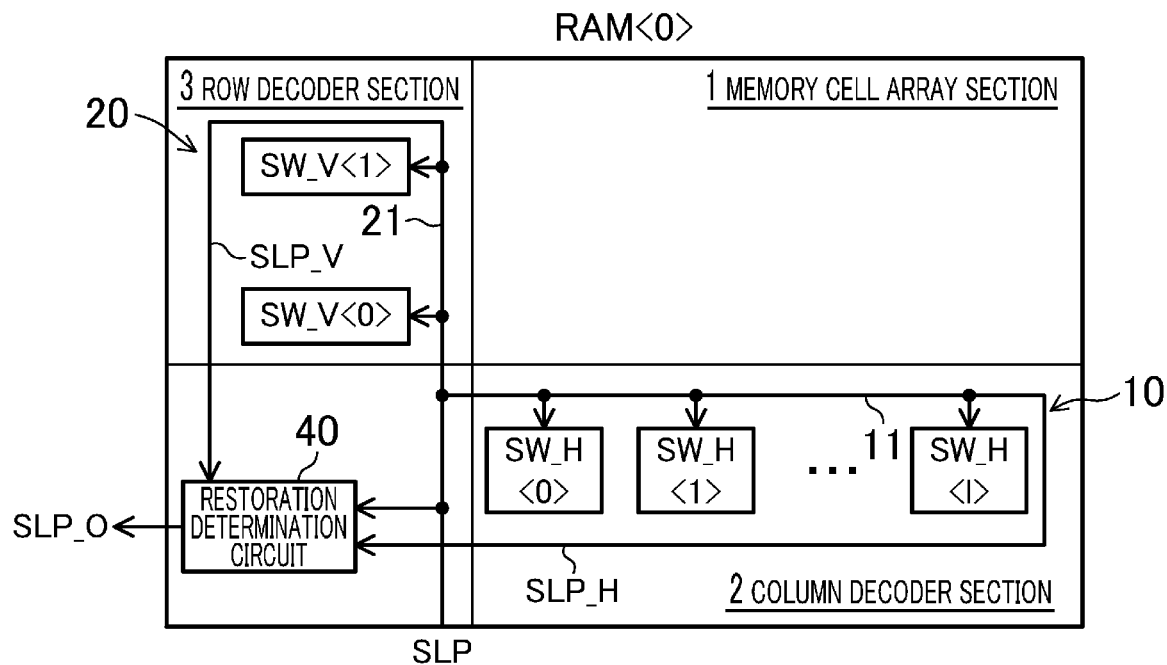
FIG. 2 is a schematic diagram illustrating an internal configuration of a circuit block illustrated in FIG. 1.

FIG. 2 is a schematic view illustrating an internal configuration of the memory block RAM <0>. In FIG. 2, the memory block RAM <0> includes a memory cell array section 1, a column decoder section 2, and a row decoder section 3. In the column decoder section 2, a plurality of first power switches 10 (that is, (1+1) first power switches 10 in this case) (SW_H <0> to <1>) are disposed in a column direction and, in the row decoder section 3, a plurality of second power switches 20 (two power switches 20 in this case) (SW_V <0> to <1>) are disposed in a row direction. A control input signal SLP that is a sleep signal received by the memory block RAM <0> is propagated to each of the first power switches 10 through a first propagation path 11, and also, is propagated to each of the second power switches 20 through a second propagation path 21. The first and second power switches 10 and 20 are on-and-off controlled by the control input signal SLP. In this case, when the control input signal SLP is high, the first and second power switches 10 and 20 are turned off, and thus, power supply to a corresponding circuit portion is cut off.

In this case, the first power switches 10 may be provided, for example, for each IO. Alternatively, the first power switches 10 may be provided for each bit line pair. Also, the second power switches 20 may be provided, for example, at both ends of the row decoder section 3.

A restoration determination circuit 40 generates a control output signal SLP_O that is a sleep signal output from the memory block RAM <0>. The restoration determination circuit 40 receives the control input signal SLP that has been given to the memory block RAM <0>, also receives, as a first signal SLP_H, the control input signal SLP that has been delayed through the first propagation path 11, and receives, as a second signal SLP_V, the control input signal SLP that has been delayed through the second propagation path 21. In this case, the restoration determination circuit 40 receives, as the first signal SLP_H, the control input signal SLP that has been propagated to a farthest end of the first propagation path 11 and receives, as the second signal SLP_V, the control input signal SLP that has been propagated to a farthest end of the second propagation path 21.

Figure 3:
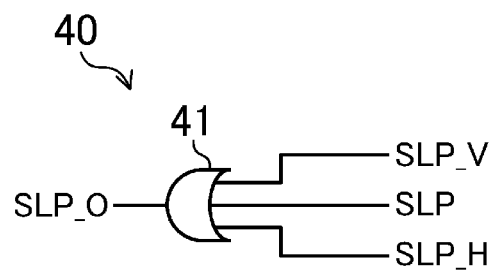
FIG. 3 is a diagram illustrating a configuration example of a restoration determination circuit illustrated in FIG. 2.

FIG. 3 is a diagram illustrating a configuration example of the restoration determination circuit 40. In a configuration of FIG. 3, the restoration determination circuit 40 includes a 3-input OR gate 41. The 3-input OR gate 41 receives the control input signal SLP, the first signal SLP_H, and the second signal SLP_V and outputs the control output signal SLP_O. Thus, when the control input signal SLP is high, the control output signal SLP_O is high. On the other hand, when the control input signal SLP transitions from high to low, the first signal SLP_H and the second signal SLP_V are delayed from the control input signal SLP to transition from high to low and the control output signal SLP_O transitions to low at a timing at which both of the first signal SLP_H and the second signal SLP_V have transitioned to low.

Figure 4:
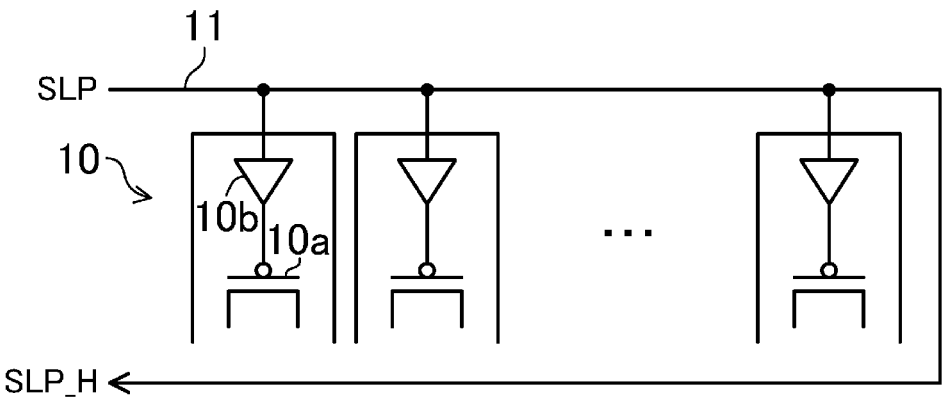
FIG. 4 is a diagram illustrating a configuration example of power switches.

FIG. 4 is a diagram illustrating a configuration example of the first power switches 10. Note that the second power switches 20 have a similar configuration. In the configuration example of FIG. 4, each of the first power switches 10 includes a power switch transistor 10a that connects and cuts off each corresponding circuit portion to and from a power source and a buffer 10b that receives the control input signal SLP and gives the control input signal SLP to a gate of the power switch transistor 10a. The control input signal SLP that has been propagated to the farthest end of the first propagation path 11 is returned, as the first signal SLP_H, to the restoration determination circuit 40. A waveform of the control input signal SLP is shaped by a buffer 10b. With this configuration, driving load capacity of the control input signal SLP can be reduced, and therefore, fast restoration from a power cutoff state is possible. Note that, instead of the buffer 10b, an inverter may be provided in accordance with a polarity of the control input signal SLP. Also, the buffer 10b may be omitted so that the control input signal SLP is directly given to the gate of the power switch transistor 10a. In general, a gate width of the power switch transistor 10a is large in order to give a sufficient current supply capability to a stable operation of the circuit block. Therefore, when the buffer 10b is omitted, a load of the control input signal SLP is large, a transition time of the sleep signal SLP is moderate and a rush current is reduced, while a restoration time is increased.

The internal configuration of each of the other memory blocks RAM <1> to <n> is similar to that of the memory block RAM <0>. That is, also in each of the memory blocks RAM <1> to <n>, the first power switches 10 are disposed in the column direction in the column decoder section 2 and the second power switches 20 are disposed in the row direction in the row decoder section 3. However, the number or disposition positions of the first power switches 10 and the second power switches 20 differ in accordance with the sizes and shapes of the memory blocks in some cases.

Figure 5:
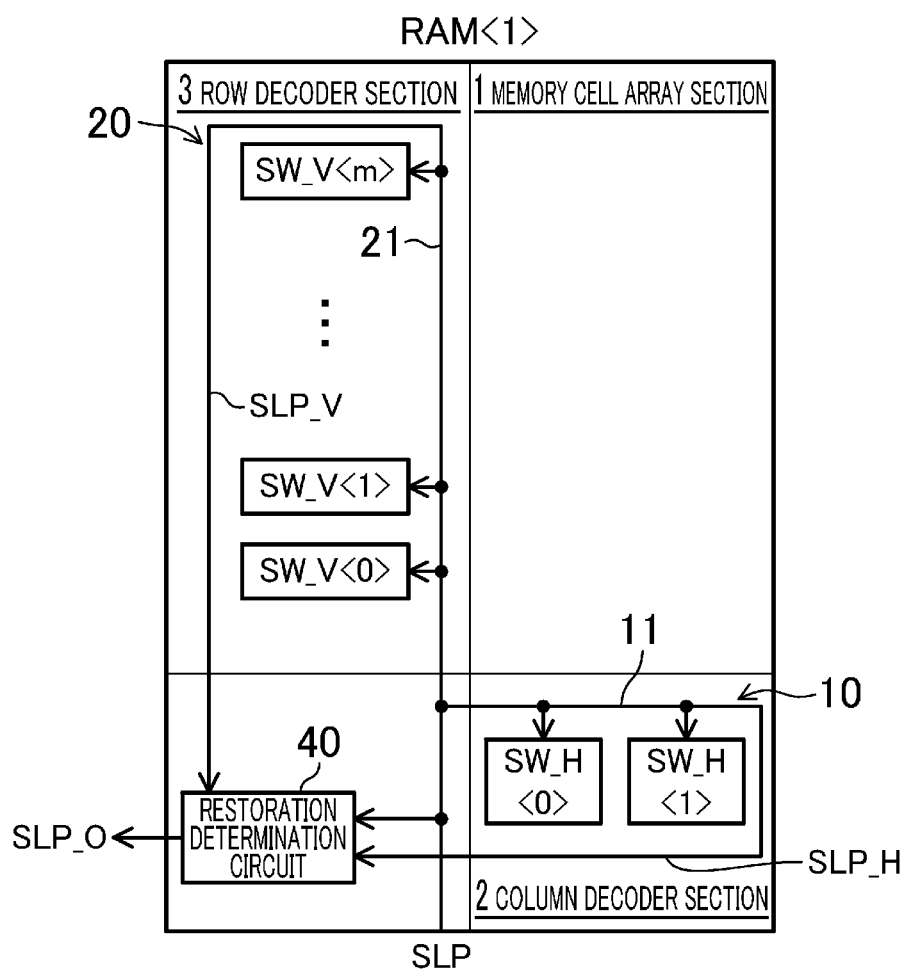
FIG. 5 is a schematic diagram illustrating an internal configuration of another circuit block illustrated in FIG. 1.

FIG. 5 is a schematic diagram illustrating an internal configuration of the circuit block RAM <1>. In this case, in contrast to the memory block RAM <0> having a laterally long shape, the memory block RAM <1> has a longitudinally long shape. That is, in the memory block RAM <1>, the column decoder section 2 is small and the row decoder section 3 is large, as compared to the memory block RAM <0>. In FIG. 5, in the column decoder section 2, the plurality of first power switches 10 (two first power switches 10 in this case) (SW_H <0> to <1>) is disposed in the column direction and, in the row decoder section 3, the plurality of second power switches 20 ((m+1) second power switches 20 in this case) (SW_V <0> to <m>) is disposed in the row direction. Other than that, the configuration of the memory block RAM <1> is similar to that of the memory block RAM <0> of FIG. 2.

As described above, in this embodiment, the restoration determination circuit 40 receives, as the first signal SLP_H, the control input signal SLP that has been propagated to the farthest end of the first propagation path 11 and also receives, as the second signal SLP_V, the control input signal SLP that has been propagated to the farthest end of the second propagation path 21. In this case, the first signal SLP_H corresponds to the control input signal SLP that has been delayed in accordance with a delay in the first propagation path 11 and the second signal SLP_V corresponds to the control input signal SLP that has been delayed in accordance with a delay in the second propagation path 21.

Therefore, in the memory block RAM <0>, a delay of the first signal SLP_H is larger than a delay of the second signal SLP_V and, in the memory block RAM <1>, the delay of the second signal SLP_V is larger than the delay of the first signal SLP_H.

Note that, although, in FIG. 2 and FIG. 5, the control input signal SLP is directly connected to the first propagation path 11 and the second propagation path 21, a buffer may be disposed in a position in which a propagation path branches off, for example. In this case, change in delay values of the first signal SLP_H and the second signal SLP_V relative to change in path lengths of the first propagation path 11 and the second propagation path 21 is more accurate.

Figure 6:
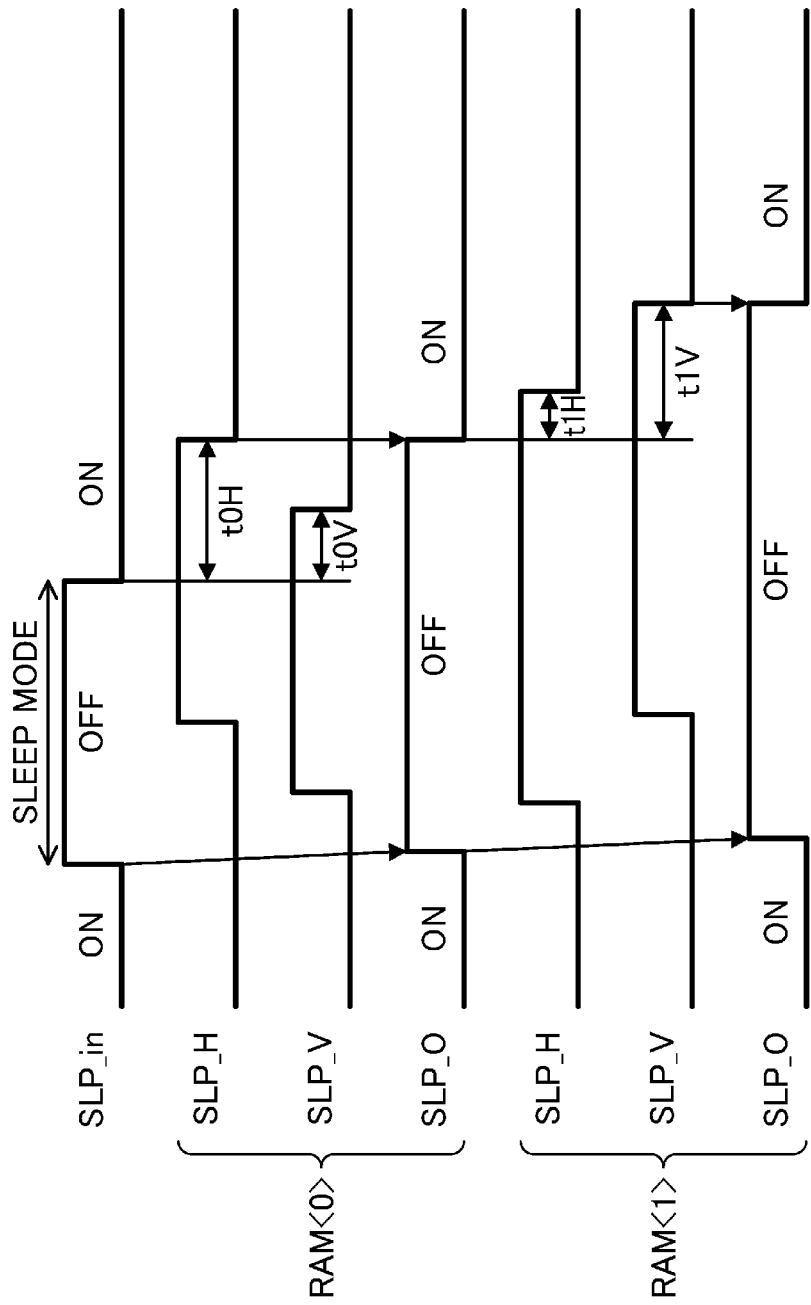
FIG. 6 is a timing chart illustrating signal change in the configuration of FIG. 1.

FIG. 6 is a timing chart illustrating signal change in the semiconductor integrated circuit 100 according to this embodiment. As illustrated in FIG. 6, when the sleep signal SLP_in transitions from low to high (this corresponds to cutoff transition), the restoration determination circuit 40 immediately causes the signal SLP_O to transition from low to high. That is, when the control input signal SLP performs cutoff transition, the restoration determination circuit 40 causes the control output signal SLP_O to perform cutoff transition in accordance with a timing at which the control input signal SLP performs cutoff transition. Thus, an instruction of power cutoff by the sleep signal SLP_in is promptly propagated to each memory block in an order of RAM <0>, RAM <1>, . . . .

On the other hand, when the sleep signal SLP_in transitions from high to low (falling, this corresponds to restoration transition), the restoration determination circuit 40 causes the signal SLP_O to transition from high to low in accordance with a later falling of fallings of the first signal SLP_H and the second signal SLP_V. That is, when the control input signal SLP performs restoration transition, the restoration determination circuit 40 causes the control output signal SLP_O to perform restoration transition in accordance with a later timing of a timing at which the first signal SLP_H performs restoration transition and a timing at which the second signal SLP_V performs restoration transition. Thus, for example, in the memory block RAM <0> having a laterally long shape, a delay t0H of the falling of the first signal SLP_H is larger than a delay t0V of the falling of the second signal SLP_V, and therefore, the control output signal SLP_O falls in accordance with the falling of the first signal SLP_H. On the other hand, in the memory block RAM <1> having a longitudinally long shape, a delay t1V of the falling of the second signal SLP_V is larger than a delay t0H of the falling of the first signal SLP_H, and therefore, the control output signal SLP_O falls in accordance with the falling of the second signal SLP_V.

As has been described above, according to this embodiment, in each memory block, the first power switches 10 are disposed in the column direction and the second power switches 20 are disposed in the row direction. The control input signal SLP that is a sleep signal given to the memory block is propagated to the first power switches 10 through the first propagation path 11 and also is propagated to the second power switches 20 through the second propagation path 21. The restoration determination circuit 40 receives the first signal SLP_H that is the control input signal SLP propagated to the farthest end of the first propagation path 11 and the second signal SLP_V that is the control input signal SLP propagated to the farthest end of the second propagation path 21 and generates the control output signal SLP_O that is the sleep signal output from the memory block.

Then, when the control input signal SLP performs restoration transition that is signal transition in which the first and second power switches 10 and 20 are turned on from off, the restoration determination circuit 40 causes the control output signal SLP_O to perform restoration transition in accordance with a later timing of a timing at which the first signal SLP_H performs restoration transition and a timing at which the second signal SLP_V performs restoration transition.

Thus, the control output signal SLP_O output from the memory block performs restoration transition at a timing in accordance with the number or the disposition positions of the first and second power switches 10 and 20, in other words, a timing in accordance with the size of the memory block. As a result, for the plurality of memory blocks connected to one another in a chain so as to propagate the sleep signal, respective power restoration timings thereof are shifted and this timing shift is a proper one in accordance with the size of each memory block. Accordingly, a time required for power restoration can be reduced to a short time and influences of a rush current can be reduced.

In this case, in general, a layout of a memory block is automatically generated by specifying a bit number, a word number, and a column number as parameters in a design tool. Then, by application of this embodiment, the first power switches 10 and the second power switches 20 are automatically generated and paths of the first signal SLP_H and the second signal SLP_V in accordance with a shape of the memory block can be formed. Thus, for the memory blocks, a timing shift of restoration transition of each of the control input signal SLP and the control output signal SLP_O can be easily set to be a proper one.

First Modified Example

In the above described embodiment, the restoration determination circuit 40 receives the first signal SLP_H that has been propagated to the farthest end of the first propagation path 11 and receives the second signal SLP_V that has been propagated to the farthest end of the second propagation path 21. However, this embodiment is not limited thereto. The first signal SLP_H may be a signal that has been delayed in accordance with a delay in the first propagation path 11 and the second signal SLP_V may be a signal that has been delayed in accordance with a delay in the second propagation path 21.

In this modified example, the restoration determination circuit 40 receives the first signal SLP_H and the second signal SLP_V not from the farthest ends of the first propagation path 11 and the second propagation path 21 but from predetermined positions in accordance with respective path lengths thereof. That is, the restoration determination circuit 40 receives the first signal SLP_H from a position located farther as the path length of the first propagation path 11 increases, and receives the second signal SLP_V from a position located farther as the path length of the second propagation path 21 increases.

Figure 7A:
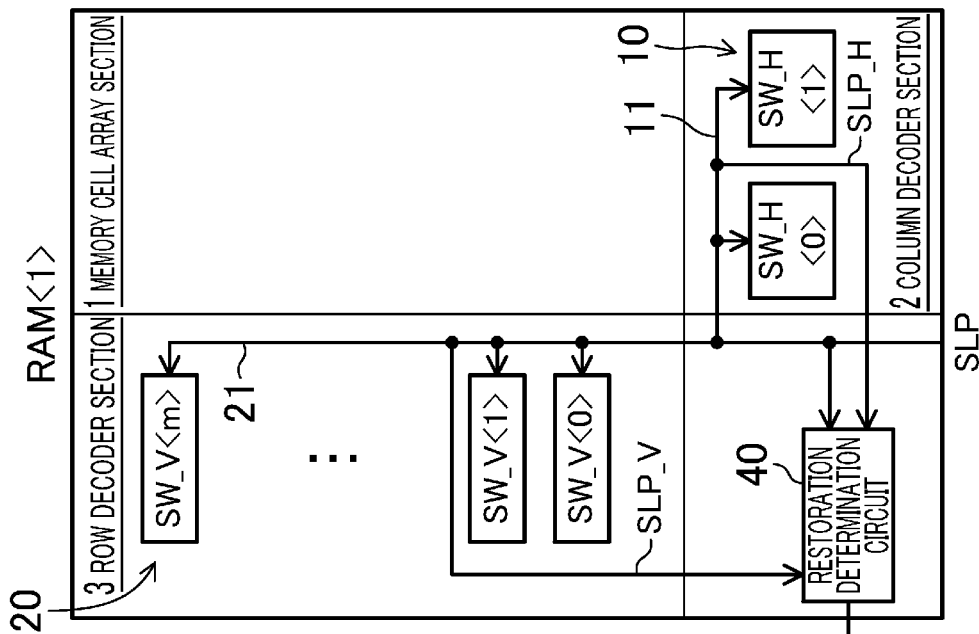
FIGS. 7A and 7B are schematic diagrams illustrating internal configurations of circuit blocks according to a first modified example.
Figure 7B:
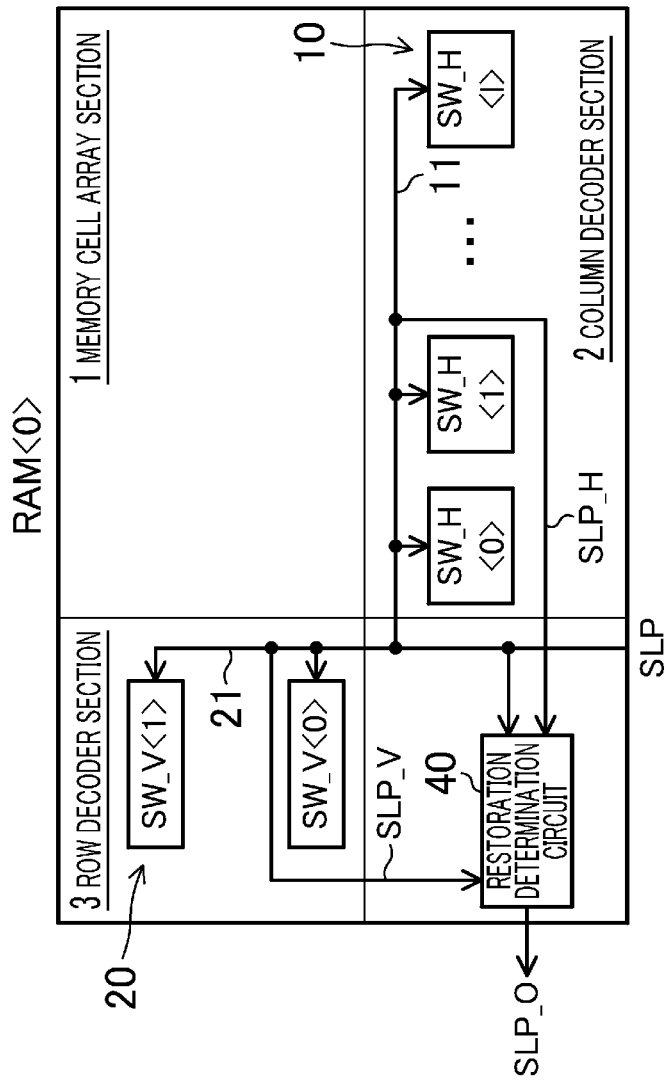

FIGS. 7A and 7B are schematic diagrams illustrating internal configurations of the memory blocks RAM <0> and RAM <1> according to the first modified example. The configuration of FIG. 7A is substantially similar to that of FIG. 2 and the configuration of FIG. 7B is substantially similar to that of FIG. 5. However, in FIGS. 7A and 7B, signal paths through which the restoration determination circuit 40 receives the first signal SLP_H and the second signal SLP_V are different from those in FIG. 2 and FIG. 5.

In FIG. 7A, the restoration determination circuit 40 receives the first signal SLP_H from around a switch SW_H <1> of the first power switches 10 and also receives the second signal SLP_V from around a switch SW_V <0> of the second power switches 20. On the other hand, in FIG. 7B, the restoration determination circuit 40 receives the first signal SLP_H from around a switch SW_H <0> of the first power switches 10 and the second signal SLP_V from around a switch SW_V <1> of the second power switches 20.

That is, the restoration determination circuit 40 receives the first signal SLP_H from the predetermined position in accordance with the path length of the first propagation path 11. The path length of the first propagation path 11 in RAM <0> is longer than that in RAM <1>, and therefore, the predetermined position in which the restoration determination circuit 40 receives the first signal SLP_H is located farther in RAM <0> than in RAM <1>. The restoration determination circuit 40 receives the second signal SLP_V from the predetermined position in accordance with the path length of the second propagation path 21. The path length of the second propagation path 21 in RAM <0> is shorter than that in RAM <1>, and therefore, the predetermined position in which the restoration determination circuit 40 receives the second signal SLP_V is located closer in RAM <0> than in RAM <1>.

Note that the predetermined positions in accordance with the path lengths may not be continuously changed relative to change in path lengths. For example, in this modified embodiment, the path lengths may be discretely changed such that, when the path length of the first propagation path 11 is in a first range, the restoration determination circuit 40 receives the first signal SLP_H from a first predetermined position and, when the path length of the first propagation path 11 is in a second range (the path length in the second range > the path length in the first range), the restoration determination circuit 40 receives the first signal SLP_H from the second predetermined position (the second predetermined position is located farther than the first predetermined position).

According to this modified example, similar effects to those of the above described embodiment may be also achieved. Also, as in the above described embodiment, when the restoration determination circuit 40 receives the first signal SLP_H and the second signal SLP_V that have been propagated to the respective farthest ends of the first propagation path 11 and the second propagation path 21, a delay amount of the control output signal SLP_O is increased to a larger amount than a necessary delay amount in some cases. In contrast, in this modified example, the delay amount of the control output signal SLP_O can be optimized and power restoration in a short time is possible.

Second Modified Example

In this modified example, the restoration determination circuit 40 receives the first signal SLP_H and the second signal SLP_V from interconnects that form the first propagation path 11 and the second propagation path 21 in a state in which a parasitic capacitance component is reflected. Also in this configuration, the first signal SLP_H is a signal that has been delayed in accordance with a delay in the first propagation path 11 and the second signal SLP_V is a signal that has been delayed in accordance with a delay in the second propagation path 21.

Figure 8:
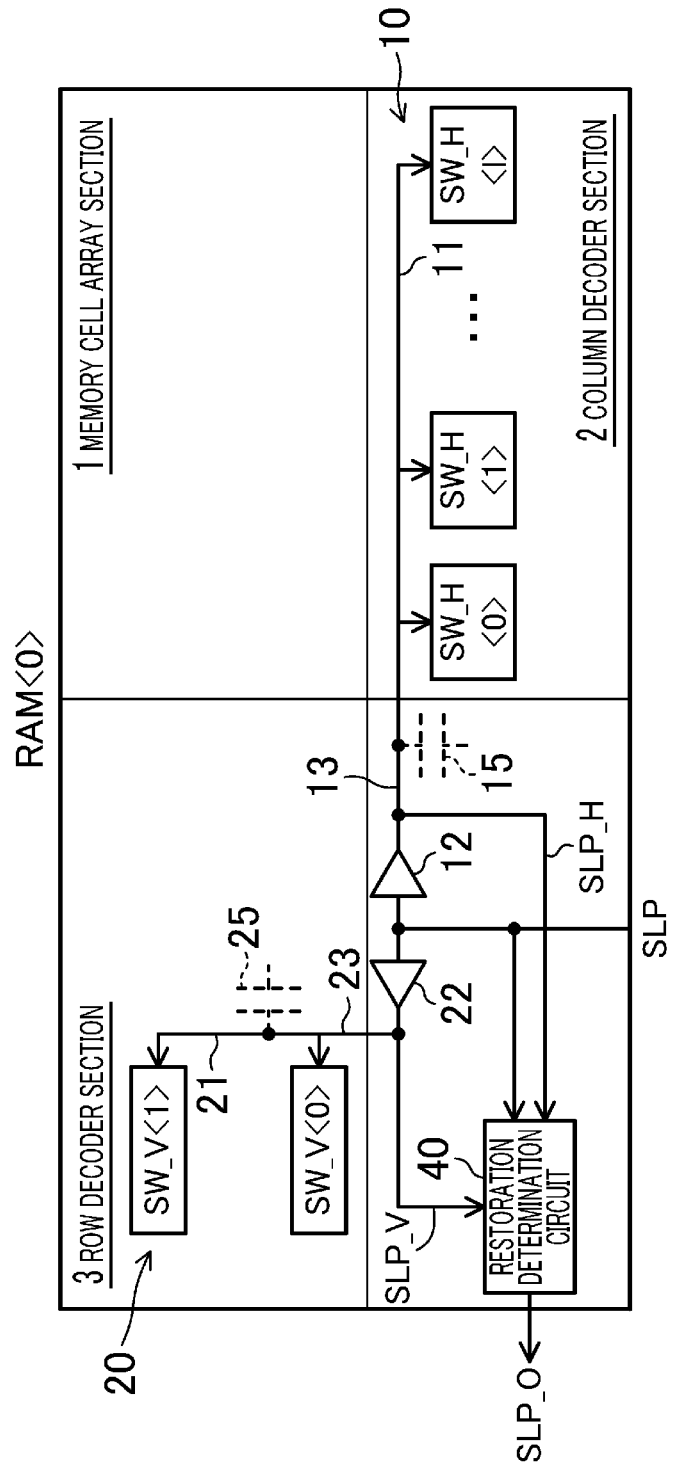
FIG. 8 is a schematic diagram illustrating an internal configuration of a circuit block according to a second modified example.

FIG. 8 is a schematic diagram illustrating an internal configuration of the memory block RAM <0> according to a second modified example. The configuration of FIG. 8 is substantially similar to that of FIG. 2. However, signal path through which the restoration determination circuit 40 receives the first signal SLP_H and the second signal SLP_V are different from those in FIG. 2. In a configuration of FIG. 8, the first propagation path 11 includes a first interconnect 13 that is connected to the first power switches 10 and receives the control input signal SLP via a buffer 12. Also, the second propagation path 21 includes a second interconnect 23 that is connected to the second power switches 20 and receives the control input signal SLP via a buffer 22. The restoration determination circuit 40 receives the control input signal SLP given to the memory block RAM <0>, receives the first signal SLP_H from the first interconnect 13, and receives the second signal SLP_V from the second interconnect 23.

In this case, the first interconnect 13 includes a parasitic capacitance component 15 and the second interconnect 23 includes a parasitic capacitance component 25. A delay in the first interconnect 13 depends on the parasitic capacitance component 15 obtained by adding a parasitic capacitance of the first interconnect 13 and an input capacitance of the first power switches 10. And a delay in the second interconnect 23 depends on the parasitic capacitance component 25 obtained by adding a parasitic capacitance of the second interconnect 23 and an input capacitance of the second power switches 20. Therefore, the first signal SLP_H corresponds to the control input signal SLP that has been delayed in accordance with the delay in the first propagation path 11 and the second signal SLP_V corresponds to the control input signal SLP that has been delayed in accordance with the delay in the second propagation path 21.

According to this modified example, similar effects to those of the above described embodiment can be also achieved. Also, it is not necessary to increase interconnect resources in the column decoder section 2 and the row decoder section 3.

Examples of Connection Form of Memory Blocks

In FIG. 1, the memory blocks are connected to one another in series and a sleep signal is transmitted sequentially from one memory block to another memory block. However, a connection form of the memory blocks is not limited thereto. For example, the memory blocks may be configured to include a branch connection structure such that a sleep signal is propagated to the plurality of memory blocks in parallel. Also, there may be a plurality of memory block groups that are connected to one another such that a sleep signal is propagated therethrough in the semiconductor integrated circuit.

Figure 9:
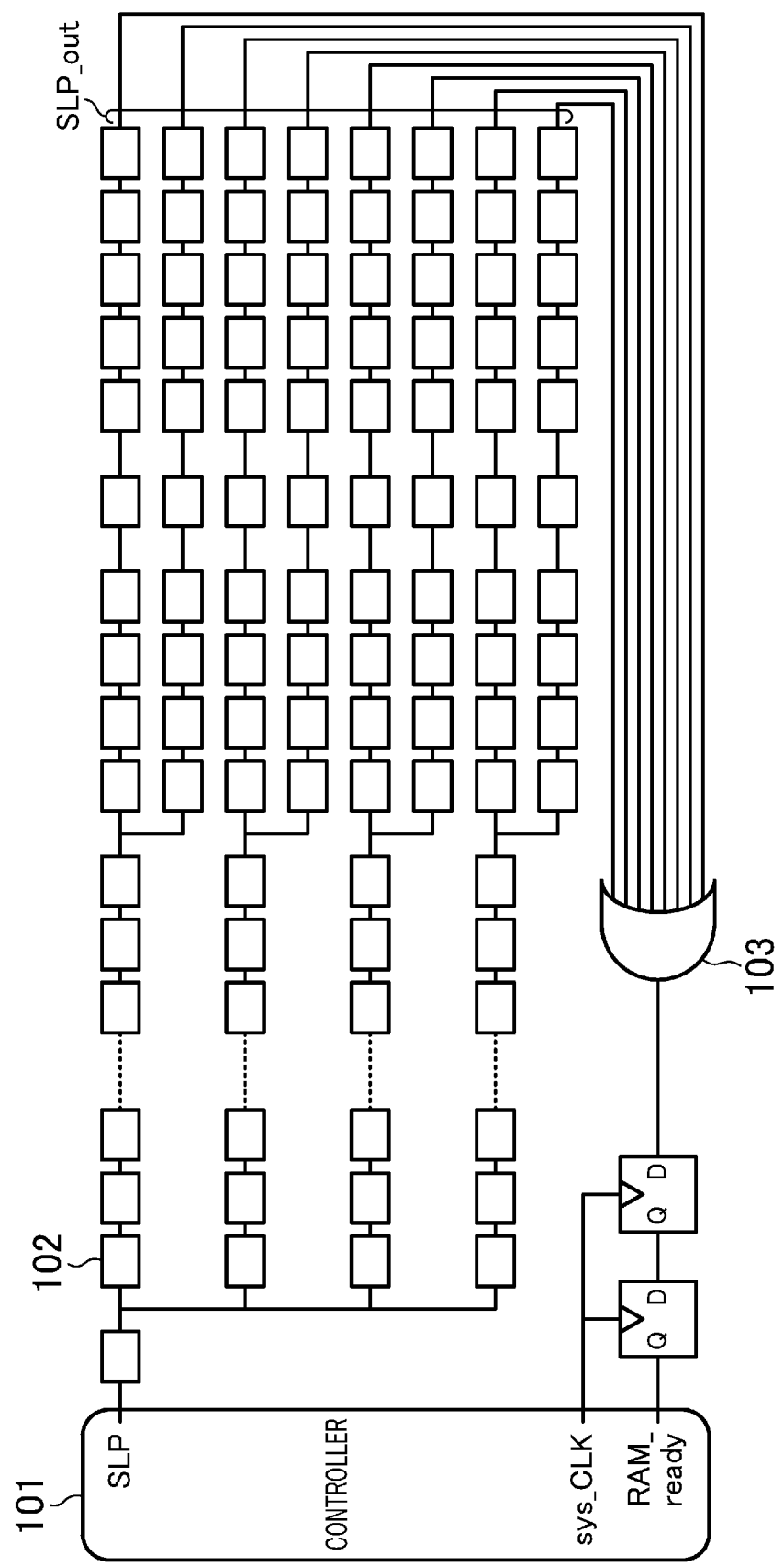
FIG. 9 is a diagram illustrating an example of a connection form of circuit blocks.

FIG. 9 is a diagram illustrating an example of a connection form of memory blocks. In a configuration of FIG. 9, a plurality of memory blocks 102 is connected to one another in a chain and branches at a plurality of portions. When a controller 101 outputs a sleep signal SLP, the sleep signal SLP is propagated through the memory blocks 102 in accordance with a chain connection and a sleep signal SLP_out is output from a terminal end of the chain. The sleep signal SLP_out is received by an OR gate 103 and an output of the OR gate 103 is returned as a restoration completion signal to the controller 101.

Second Embodiment

In a second embodiment, a semiconductor integrated circuit has, as a low power consumption mode, a shutdown mode in addition to the sleep mode described in the first embodiment. For example, in memory blocks, in the shutdown mode, most circuits that include a memory cell array are put in a power cutoff state. In the shutdown mode, memory data of a memory is also deleted. In the present disclosure, a power control signal that puts the semiconductor integrated circuit in the shutdown mode is referred to as a shutdown signal. In this case, when the shutdown signal is high, power supply to each circuit of a power supply target is cut off and, when the shutdown signal is low, power supply to each circuit is maintained. Note that a relationship between the shutdown signal and cutoff/maintenance of power supply is not limited thereto.

Figure 10:
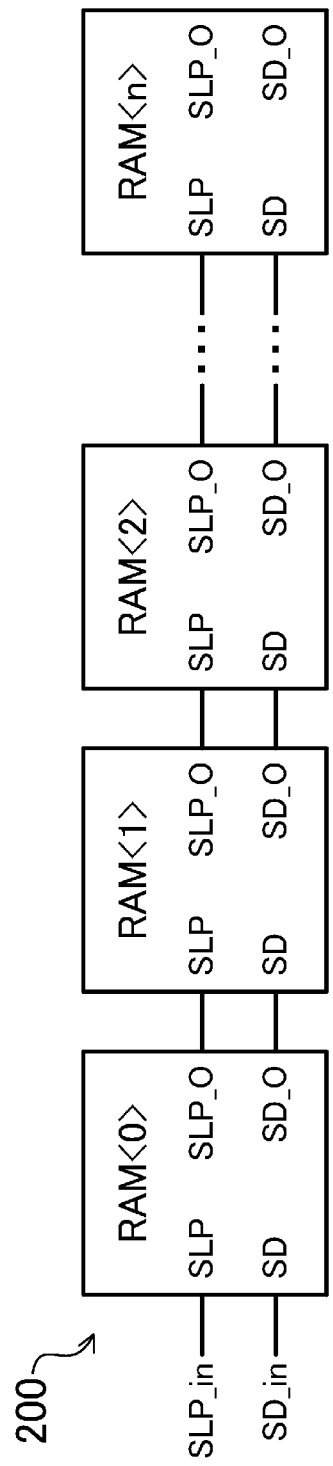
FIG. 10 is a block diagram illustrating a portion of a configuration of a semiconductor integrated circuit according to a second embodiment.

FIG. 10 is a block diagram illustrating a portion of a configuration of a semiconductor integrated circuit according to the second embodiment. A semiconductor integrated circuit 200 illustrated in FIG. 10 includes a plurality of memory blocks RAM <0> to <n>. The memory blocks RAM <0> to <n> are, for example, SRAMs. Note that the memory blocks RAM <0> to <n> are examples of circuit blocks. The plurality of memory blocks RAM <0> to <n> is connected to one another in a chain so as to propagate a sleep signal SLP_in and the shutdown signal SD_in each of which is an example of the power control signal. That is, RAM <0> receives the given sleep signal SLP_in as the signal SLP, performs power control in the block in accordance with the signal SLP, and delays and outputs the signal SLP as a signal SLP_O. RAM <1> receives the signal SLP_O output from RAM <0> as the signal SLP, performs power control in the block in accordance with the sleep signal SLP, and delays and outputs the sleep signal SLP as a signal SLP_O. Thereafter, in a similar manner, the sleep signal is transmitted to RAM <2> . . . RAM <n>. Also, RAM <0> receives a given shutdown signal SD_in as a signal SD, performs power control in the block in accordance with the signal SD, and delays and outputs the signal SD as a signal SD_O. RAM <1> receives the signal SD_O output from RAM <0> as the signal SD, performs power control in the block in accordance with the signal SD, and delays and outputs the signal SD as the signal SD_O. Thereafter, in a similar manner, the shutdown signal is transmitted to RAM <2> . . . RAM <n>.

Figure 11:
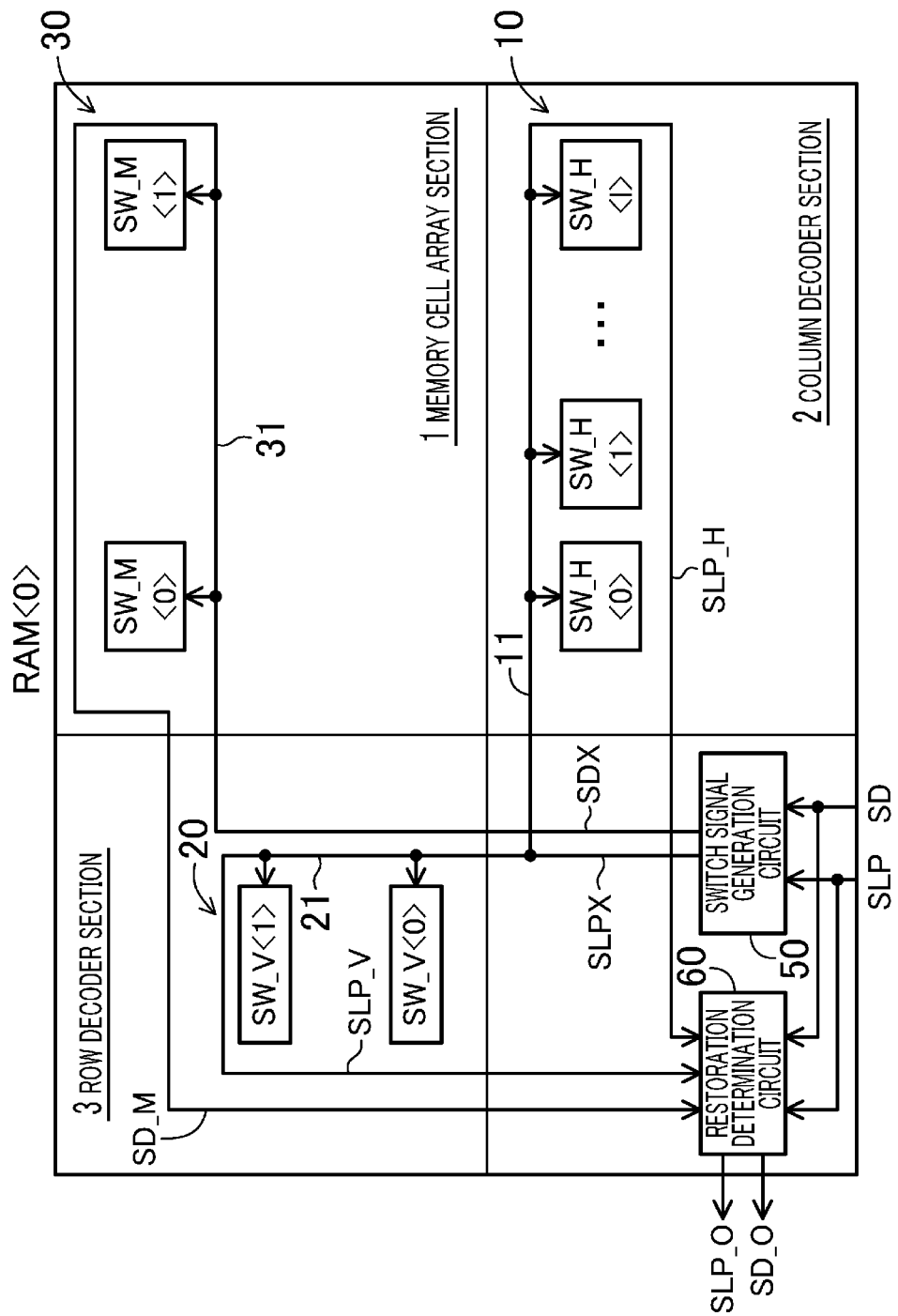
FIG. 11 is a schematic diagram illustrating an internal configuration of a circuit block illustrated in FIG. 10.

FIG. 11 is a schematic diagram illustrating an internal configuration of the memory block RAM <0>. In FIG. 11, the memory block RAM <0> includes a memory cell array section 1, a column decoder section 2, and a row decoder section 3. In the column decoder section 2, a plurality of first power switches 10 ((1+1) power switches 10 in this case) (SW_H <0> to <1>) is disposed in a column direction and, in the row decoder section 3, a plurality of second power switches 20 (two power switches 20 in this case) (SW_V <0> to <1>) is disposed in a row direction. These configurations are similar to those in FIG. 2 of the first embodiment.

In a configuration of FIG. 11, a plurality of third power switches 30 (two power switches 30 in this case) (SW_M <0> to <1>) is disposed in the column direction. Note that the third power switches 30 may be disposed in the row direction. Also, in the configuration of FIG. 11, the third power switches 30 are disposed in a portion of the memory cell array section 1 in an upper portion of FIG. 11, but the disposition positions of the third power switches 30 are not limited thereto. For example, the third power switches 30 may be disposed in a portion of the memory cell array section 1 in a lower portion of FIG. 11.

In this case, the sleep signal corresponds to the first power control signal that controls on and off of the first and second power switches 10 and 20. The shutdown signal corresponds to the second power control signal that controls on and off of the first to third power switches 10 to 30.

A switch signal generation circuit 50 receives a first control input signal SLP that is the sleep signal received by the memory block RAM <0> and a second control input signal SD that is the shutdown signal received by the memory block RAM <0>. Then, the switch signal generation circuit 50 generates a first switch signal SLPX that controls on and off of the first and second power switches 10 and 20 and a second switch signal SDX that controls on and off of the third power switches 30. Specifically, when the first control input signal SLP is high (in the sleep mode), the switch signal generation circuit 50 makes the first switch signal SLPX high such that the first and second power switches 10 and 20 are turned off. Also, when a second control input signal SD is high (in the shutdown mode), the switch signal generation circuit 50 makes each of the first and second switch signals SLPX and SDX high such that all of the first to third power switches 10 to 30 are turned off. That is, when the first control input signal SLP is high or when the second control input signal SD is high, the first switch signal SLPX becomes high, and when the second control input signal SD is high, the second switch signal SDX becomes high.

The first switch signal SLPX that has been output from the switch signal generation circuit 50 is propagated to each of the first power switches 10 through the first propagation path 11 and is also propagated to each of the second power switches 20 through the second propagation path 21. In this case, when the first switch signal SLPX is high, the first and second power switches 10 and 20 are controlled to off, and thus, power supply to a corresponding circuit portion is cut off. Also, the second switch signal SDX that has been output from the switch signal generation circuit 50 is propagated to the third power switches 30 through a third propagation path 31. In this case, when the second switch signal SDX is high, the third power switches 30 are controlled to off, and thus, power supply to a corresponding circuit portion is cut off.

A restoration determination circuit 60 generates first and second control output signals SLP_O and SD_O that are the sleep signal and the shutdown signal output from the memory block RAM <0>. The restoration determination circuit 60 receives the first and second control input signals SLP and SD that have been given to the memory block RAM <0>, receives, as the first signal SLP_H, the first switch signal SLPX that has been delayed through the first propagation path 11, and also receives, as the second signal SLP_V, the first switch signal SLPX that has been delayed through the second propagation path 21. Also, the restoration determination circuit 60 receives, as a third signal SD_M, the second switch signal SDX that has been delayed through the third propagation path 31. In this case, the restoration determination circuit 60 receives, as the first signal SLP_H, the first switch signal SLPX that has been propagated to the farthest end of the first propagation path 11, receives, as the second signal SLP_V, the first switch signal SLPX that has been propagated to the farthest end of the second propagation path 21, and also, receives, as the third signal SD_M, the second switch signal SDX that has been propagated to the farthest end of the third propagation path 31.

Figure 12:
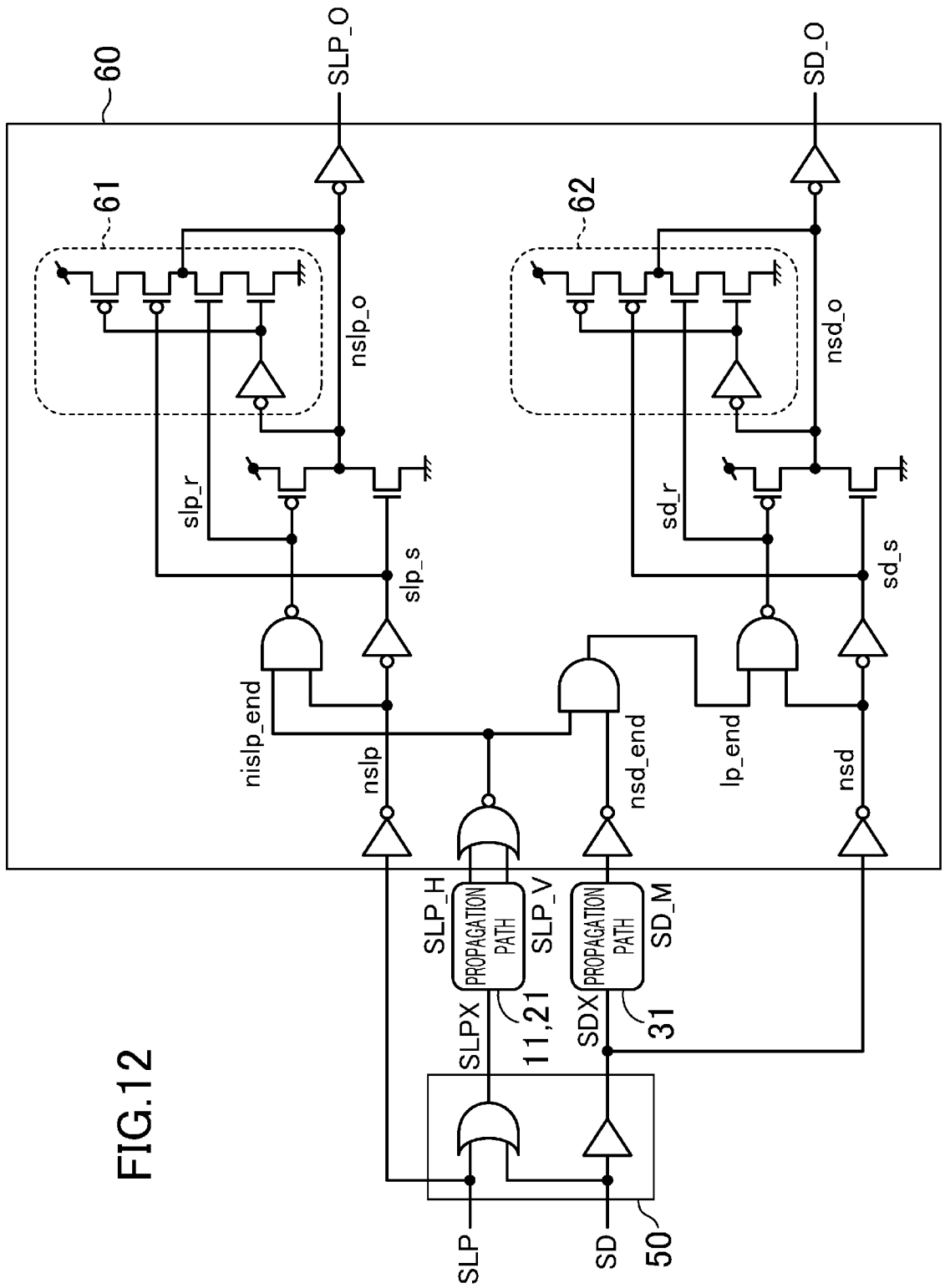
FIG. 12 is a diagram illustrating a configuration example of a switch signal generation circuit and a restoration circuit illustrated in FIG. 11.
Figure 13:
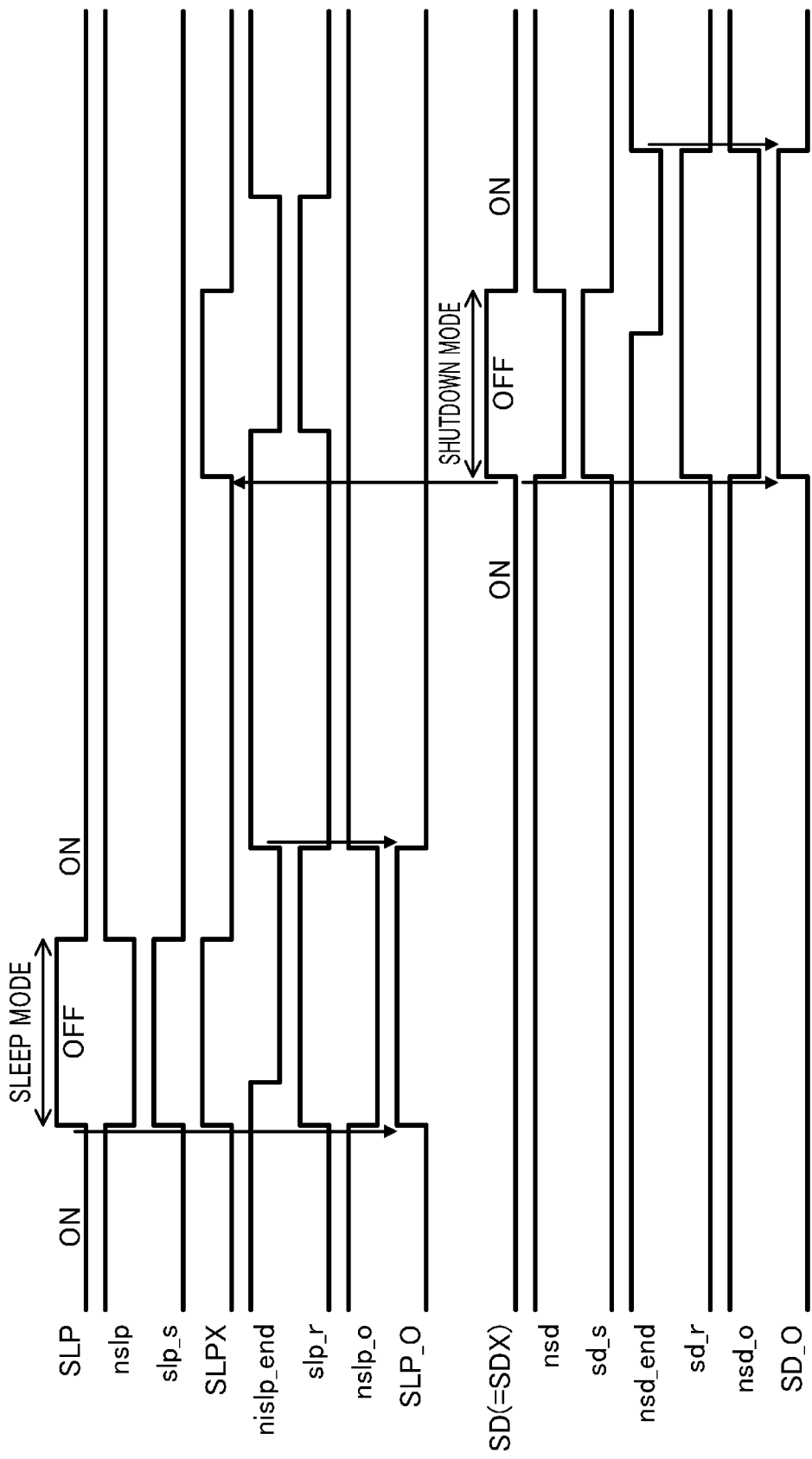
FIG. 13 is a timing chart illustrating an operation of a circuit configuration of FIG. 12.

FIG. 12 is a diagram illustrating a circuit configuration example of the switch signal generation circuit 50 and the restoration determination circuit 60. Also, FIG. 13 is a timing chart illustrating an operation of a circuit configuration of FIG. 12.

A circuit of FIG. 12 operates in a manner described below in the sleep mode. When the first control input signal SLP transitions from low to high (this corresponds to cutoff transition), the circuit is put in the sleep mode. At this time, the switch signal generation circuit 50 changes the first switch signal SLPX to high. The first switch signal SLPX is propagated to the first power switches 10 through the first propagation path 11 and is also propagated to the second power switches 20 through the second propagation path 21. Thus, the first and second power switches 10 and 20 are turned off. Also, when the first control input signal SLP transitions from low to high, in the restoration determination circuit 60, the first control output signal SLP_O is immediately changed to high through a path SLP→nslp→slp_s→nslp_o→SLP_O. At this time, a signal slp_r is high, and therefore, a node of a signal nslp_o is fixed low by a function of a latch section 61. That is, when the first control input signal SLP performs cutoff transition, the restoration determination circuit 60 causes the first control output signal SLP_O to perform cutoff transition in accordance with a timing at which the first control input signal SLP performs cutoff transition. Thus, an instruction of power cutoff by the sleep signal SLP_in is promptly propagated to each memory block in an order of RAM <0>, RAM <1>, . . . .

When the first control input signal SLP transitions from high to low (this corresponds to restoration transition), the sleep mode is cleared. However, the signal slp_r is still high, and therefore, the node of the signal nslp_o is still fixed low by the function of the latch section 61 and the first control output signal SLP_O remains high. Thereafter, when the first signal SLP_H from the first propagation path 11 and the second signal SLP_V from the second propagation path 21 transition from high to low, a signal nislp_end is changed to high in accordance with a later timing of timings of transitions of the first signal SLP_H and the second signal SLP_V, so that the signal slp_r is changed to low, the signal nslp_o is changed to high, and the first control output signal SLP_O is changed to low.

On the other hand, in the shutdown mode, the circuit of FIG. 12 operates in a manner described below. When the second control input signal SD transitions from low to high (this corresponds to second cutoff transition), the circuit is put in the shutdown mode. At this time, the switch signal generation circuit 50 changes each of the first and second switch signals SLPX and SDX to high. The first switch signal SLPX is propagated to the first power switches 10 through the first propagation path 11 and is also propagated to the second power switches 20 through the second propagation path 21. Thus, the first and second power switches 10 and 20 are turned off. The second switch signal SDX is propagated to the third power switches 30 through the third propagation path 31. Thus, the third power switches 30 are turned off. Also, when the second control input signal SD transitions from low to high, in the restoration determination circuit 60, the second control output signal SD_O is immediately changed to high through a path SD→nsd→sd_s→nsd_o→SD_O. At this time, the signal sd_r is high, and therefore, a node of a signal nsd_o is fixed low by a function of a latch section 62. That is, when the second control signal SD performs second cutoff transition, the restoration determination circuit 60 causes the second control output signal SD_O to perform the second cutoff transition in accordance with a timing at which the second control input signal SD performs the second cutoff transition. Thus, an instruction of power cutoff by the shutdown signal SD_in is promptly propagated to each memory block in the order of RAM <0>, RAM <1>, . . . . Also, at this time, the first control output signal SLP_O is not changed by a function of the latch section 61.

When the second control input signal SD transitions from high to low (this corresponds to second restoration transition), the shutdown mode is cleared. However, the signal sd_r is still high, and therefore, the node of the signal nsd_o is fixed low by a function of the latch section 62 and the second control output signal SD_O remains high. Thereafter, when the first signal SLP_H from the first propagation path 11, the second signal SLP_V from the second propagation path 21, and the third signal SD_M from the third propagation path 31 transition from low to high, the signal sd_r is changed to low in accordance with a latest timing of timings of transitions of the first signal SLP_H, the second signal SLP_V, and the third signal SD_M, and the signal nsd_o is changed to high, and the second control output signal SD_O is changed to low. In the example of FIG. 13, transition of the third signal SD_M from high to low is later than transitions of the first signal SLP_H and the second signal SLP_V, and therefore, the second control output signal SD_O is changed to low in accordance with a rise of a signal nsd_end.

As described above, in this embodiment, the restoration determination circuit 60 receives, as the first signal SLP_H, the first switch signal SLPX that has been propagated to the farthest end of the first propagation path 11 and also receives, as the second signal SLP_V, the first switch signal SLPX that has been propagated to the farthest end of the second propagation path 21. Also, the restoration determination circuit 60 receives, as the third signal SD_M, the second switch signal SDX that has been propagated to the farthest end of the third propagation path 31. In this case, the first signal SLP_H corresponds to the first switch signal SLPX that has been delayed in accordance with a delay in the first propagation path 11, the second signal SLP_V corresponds to the first switch signal SLPX that has been delayed in accordance with a delay in the second propagation path 21, and the third signal SD_M corresponds to the second switch SDX that has been delayed in accordance with a delay in the third propagation path 31.

Therefore, in this embodiment, similar effects to those of the first embodiment can be achieved. That is, according to this embodiment, in each memory block, the first power switches 10 are disposed in the column direction, the second power switches 20 are disposed in the row direction, and the third power switches 30 are disposed in the column direction or the row direction. The switch signal generation circuit 50 generates, based on the first and second control input signals SLP and SD that are the sleep signal and the shutdown signal given to the memory block, the first switch signal SLPX that controls the first and second power switches 10 and 20 and the second switch signal SDX that controls the third power switches 30. The first switch signal SLPX is propagated to the first power switches 10 through the first propagation path 11 and is also propagated to the second power switches 20 through the second propagation path 21. The second switch signal SDX is propagated to the third power switches 30 through the third propagation path 31. The restoration determination circuit 60 receives the first signal SLP_H that is the first switch signal SLPX propagated to the farthest end of the first propagation path 11, the second signal SLP_V that is the first switch signal SLPX propagated to the farthest end of the second propagation path 21, and the third signal SD_M that is the second switch SDX propagated to the farthest end of the third propagation path 31 and generates the first and second control output signals SLP_O and SD_O that are the sleep signal and the shutdown signal output from the corresponding memory block.

Then, when the first control input signal SLP performs restoration transition that is signal transition in which the first and second power switches 10 and 20 are turned on from off, the restoration determination circuit 60 causes the first control output signal SLP_O to perform restoration transition in accordance with a later timing of a timing at which the first signal SLP_H performs restoration transition and a timing at which the second signal SLP_V performs restoration transition. Thus, the first control output signal SLP_O that is output from the memory block preforms restoration transition at a timing in accordance with the number and the disposition positions of the first and second power switches 10 and 20, in other words, a timing in accordance with the size of the memory block.

Also, when the second control input signal SD performs second restoration transition that is signal transition in which the first to third power switches 10 to 30 are turned on from off, the restoration determination circuit 60 causes the second control output signal SD_O to perform the second restoration transition in accordance with a latest timing of a timing at which the first signal SLP_H performs the second restoration transition, a timing at which the second signal SLP_V performs the second restoration transition, and a timing at which the third signal SD_M performs the second restoration transition. Thus, the second control output signal SD_O that has been output from the memory block performs restoration transition at a timing in accordance with the number or the disposition positions of the first to third power switches 10 to 30, in other words, a timing in accordance with the size of the circuit block.

As a result, for the plurality of memory blocks connected to one another in a chain so as to propagate the sleep signal and the shutdown signal, respective power restoration timings thereof are shifted and this timing shift is a proper one in accordance with the size of each memory block. Accordingly, a time required for power restoration can be reduced to a short time and influences of a rush current can be reduced.

Note that, in this embodiment, the restoration determination circuit 60 receives the first signal SLP_H that has been propagated to the farthest end of the first propagation path 11, receives the second signal SLP_V that has been propagated to the farthest end of the second propagation path 21, and receives the third signal SD_M that has been propagated to the farthest end of the third propagation path 31. However, this embodiment is not limited thereto. The first signal SLP_H may be a signal that has been delayed in accordance with a delay in the first propagation path 11, the second signal SLP_V may be a signal that has been delayed in accordance with a delay in the second propagation path 21, and the third signal SD_M may be a signal that has been delayed in accordance with a delay in the third propagation path 31. Therefore, in this embodiment, for example, each modified example descried in the first embodiment can be applied.

Note that, in each of the above described embodiments, the deposition positions and the number of the first to third power switches 10 to 30 are not limited to those that have been described above. Also, each of the respective numbers of the first to third power switches 10 to 30 may be one.

Also, each of the above described embodiments has been described above using the memory blocks as an example of the circuit blocks. However, the circuit blocks disclosed herein are not limited to the memory blocks. Also, the first power switches 10 are disposed in the column direction and the second power switches 20 are disposed in the row direction, but disposition directions of the power switches are not limited thereto.

Also, in each of the above described embodiments, a relay buffer may be inserted, as appropriate, in middle of each propagation path. In this case, adjustment of a size of a transistor that forms the relay buffer may be performed as appropriate and, in order to reduce influences of noise of each propagation path, the relay buffer may be a Schmitt buffer.

According to the present disclosure, in a semiconductor integrated circuit that employs power gating, a time required for power restoration can be reduced to a short time, influences of a rush current can be reduced, and therefore, the present disclosure is useful, for example, for achieving both of reduced power consumption and operation stability of a semiconductor chip.

What is claimed is:
1. A semiconductor integrated circuit, comprising:
a circuit block including one or more first power switches disposed in a first direction and one or more second power switches disposed in a second direction,
wherein
the circuit block includes
a first propagation path through which a control input signal given to the circuit block is propagated to the one or more first power switches, the control input signal being a power control signal that controls on and off of the first and second power switches,
a second propagation path through which the control input signal is propagated to the one or more second power switches, and
a restoration determination circuit that receives a first signal that is the control input signal that has been delayed in accordance with a delay in the first propagation path and a second signal that is the control input signal that has been delayed in accordance with a delay in the second propagation path and generates a control output signal that is the power control signal that is output from the circuit block, and
when the control input signal performs restoration transition that is signal transition in which the first and second power switches are turned on from off, the restoration determination circuit causes the control output signal to perform the restoration transition in accordance with a later timing of a timing at which the first signal performs the restoration transition and a timing at which the second signal performs the restoration transition.

2. The semiconductor integrated circuit of claim 1, wherein
the restoration determination circuit receives, as the first signal, the control input signal that has been propagated to a farthest end of the first propagation path and also receives, as the second signal, the control input signal that has been propagated to a farthest end of the second propagation path.

3. The semiconductor integrated circuit of claim 1, wherein
the restoration determination circuit receives the first signal from a first predetermined position of the first propagation path and also receives the second signal from a second predetermined position of the second propagation path, and
the first predetermined position is a position in accordance with a path length of the first propagation path and the second predetermined position is a position in accordance with a path length of the second propagation path.

4. The semiconductor integrated circuit according to claim 1, wherein
the first propagation path includes a first interconnect that is connected to the one or more first power switches and receives the control input signal via a buffer,
the second propagation path includes a second interconnect that is connected to the one or more second power switches and receives the control input signal via a buffer, and
the restoration determination circuit receives the first signal from the first interconnect and also receives the second signal from the second interconnect.

5. The semiconductor integrated circuit of claim 1, wherein
when the control input signal performs cutoff transition that is signal transition in which the first and second power switches are turned off from on, the restoration determination circuit causes the control output signal to perform the cutoff transition in accordance with a timing at which the control input signal performs the cutoff transition.

6. The semiconductor integrated circuit of claim 1, comprising:
a plurality of the circuit blocks,
wherein
the plurality of the circuit blocks are connected to one another in a chain so as to propagate the power control signal.

7. The semiconductor integrated circuit of claim 1, wherein
the circuit block is a memory block,
the one or more first power switches are disposed in a column direction, and
the one or more second power switches are disposed in a row direction.

8. A semiconductor integrated circuit, comprising:
a circuit block including one or more first power switches disposed in a first direction, one or more second power switches disposed in a second direction, and one or more third power switches disposed in the first or second direction,
wherein
the circuit block includes
a switch signal generation circuit that generates, based on first and second control input signals given to the circuit block, a first switch signal that controls on and off of the first and second power switches and a second switch signal that controls on and off of the third power switches, the first control input signal being a first power control signal that controls on and off of the first and second power switches and the second control input signal being a second power control signal that controls on and off of the first to third power switches,
a first propagation path through which the first switch signal is propagated to the one or more first power switches,
a second propagation path through which the first switch signal is propagated to the one or more second power switches,
a third propagation path through which the second switch signal is propagated to the one or more third power switches,
a restoration determination circuit that receives a first signal that is the first switch signal that has been delayed in accordance with a delay in the first propagation path, a second signal that is the first switch signal that has been delayed in accordance with a delay in the second propagation path, and a third signal that is the second switch signal that has been delayed in accordance with a delay in the third propagation path and generates first and second control output signals that are the first and second power control signals that are output from the circuit block, and
when the first control input signal performs restoration transition that is signal transition in which the first and second power switches are turned on from off,
the switch signal generation circuit causes the first switch signal to perform the restoration transition, and
the restoration determination circuit causes the first control output signal to perform the restoration transition in accordance with a later timing of a timing at which the first signal performs the restoration transition and a timing at which the second signal performs the restoration transition, and
when the second control input signal performs second restoration transition that is signal transition in which the first to third power switches are turned on from off,
the switch signal generation circuit causes the first and second switch signals to perform the second restoration transition, and
the restoration determination circuit causes the second control output signal to perform the second restoration transition in accordance with a latest timing of a timing at which the first signal performs the second restoration transition, a timing at which the second signal performs the second restoration transition, and a timing at which the third signal performs the second restoration transition.

9. The semiconductor integrated circuit of claim 8, wherein
the restoration determination circuit
causes, when the first control input signal performs cutoff transition that is signal transition in which the first and second power switches are turned off from on, the first control output signal to perform the cutoff transition in accordance with a timing at which the first control input signal performs the cutoff transition, and
causes, when the second control input signal performs second cutoff transition that is signal transition in which the first to third power switches are turned off from on, the second control output signal to perform the second cutoff transition in accordance with a timing at which the second control input signal performs the second cutoff transition.

10. The semiconductor integrated circuit according to claim 8, comprising:
a plurality of the circuit blocks,
wherein
the plurality of the circuit blocks are connected to one another in a chain so as to propagate the first and second power control signals.

11. The semiconductor integrated circuit of claim 8, wherein
the circuit block is a memory block,
the one or more first power switches are disposed in a column direction, and
the one or more second power switches are disposed in a row direction.

* * * * *